United States Patent [19]

Marsing

[11] Patent Number: 4,599,592
[45] Date of Patent: Jul. 8, 1986

[54] DEVICE FOR HOLDING THE HOUSING OF A SUPERCONDUCTING MAGNET WINDING

[75] Inventor: Helmut Marsing, Neunkirchen, Fed. Rep. of Germany

[73] Assignee: Siemens Aktiengesellschaft, Munich, Fed. Rep. of Germany

[21] Appl. No.: 697,627

[22] Filed: Feb. 4, 1985

[30] Foreign Application Priority Data

Feb. 27, 1984 [DE] Fed. Rep. of Germany ....... 3407058

[51] Int. Cl.$^4$ ............................................. H01F 7/22
[52] U.S. Cl. .................................................. 335/216
[58] Field of Search ................... 335/216; 174/15 CA, 174/17 VA

[56] References Cited

U.S. PATENT DOCUMENTS

| | | | |
|---|---|---|---|
| 3,389,353 | 6/1968 | Kafka et al. ........................... | 335/216 |
| 3,996,545 | 12/1976 | Elsel et al. ......................... | 335/216 X |
| 4,379,275 | 4/1983 | Elsel ..................................... | 335/216 |

OTHER PUBLICATIONS

"National Accelerator Laboratory", The Heim Column; A Low Heat Leak Temperature Stabilized Support; J. B. Heim; Dec. 10, 1971.

*Primary Examiner*—George Harris
*Attorney, Agent, or Firm*—Kenyon & Kenyon

[57] ABSTRACT

A device for holding the winding housing of a superconducting magnet winding which is to be cooled to a low temperature, the winding housing surrounded by a cooled radiation protection shield, which itself is enclosed by an outer housing approximately at room temperature, includes at least one rigid tubular support element which has low thermal conductivity, arranged between the outer housing and the winding housing and connected to the radiation protection shield. In order that the holding device causes only minimal heat transfer into the cold winding housing and still permits safe transport of the warm structure, the winding housing is suspended in the outer housing by means of a poorly heat-conducting suspension device, and the tubular support element is designed to have a variable length, so that a form-locking fit between with the outer housing and the winding housing is set at room temperature. The support element is attached by means of a fastening device comprising a spring element to the radiation protection shield in such a manner that a form-locking fit with the outer housing always exists, so that as the winding housing shrinks with cooling, the support no longer contacts the winding housing and heat transfer through the support element to the winding housing is no longer possible.

20 Claims, 2 Drawing Figures

DEVICE FOR HOLDING THE HOUSING OF A SUPERCONDUCTING MAGNET WINDING

BACKGROUND OF THE INVENTION

This invention relates to a superconducting magnet winding in general and more particularly to a device for holding the housing of a superconducting magnet winding.

A known device for holding a winding housing provided for a superconducting magnet winding, which can be cooled to a low temperature, is surrounded by at least one protective radiation shield which can be kept at a comparatively higher temperature. The radiation shield and winding housing are arranged in an outer housing which is approximately at room temperature. The holding device comprises at least one rigid tubular support element which is arranged between the outer housing and the winding housing and is connected to the protective radiation shield, and consists, at least partially, of poorly heat-conducting material. Such a holding device is described in a report of the "National Accelerator Laboratory", USA, No. TM-334A, 2791.000 dated Dec. 10, 1971, and entitled "Tne Heim Column".

In superconducting magnet devices, a winding housing, in which the superconducting magnet winding to be cooled is contained, is frequently arranged within a vacuum or outer housing which is at room temperature of about 300 K. This winding housing can therefore likewise be cooled down to the low temperature of the magnet winding and is therefore also called the helium housing. For thermal reasons, at least one protective radiation shield or housing is also provided between the outer housing and the winding housing. The radiation shield is kept, in general, at a temperature between about 40 K and 100 K. For such a structure a holding device with tension or support elements for all three axes is required, through which amounts of heat as small as possible are to be transmitted to the cooled structural parts. For the design of such a holding device, dynamic force components must be considered, in addition to the existing weight masses of the parts, such as forces occurring due to accelerations in the case of shipping.

Because of these requirements, the most varied tension or support elements have been used heretofore, using different materials such as 18/8 CrNi steel, titanium or fiberglass-reinforced plastics. Accordingly, the holding device known from the report cited above consists of several support elements which must be arranged between the outer housing and the winding housing and can be connected to a radiation protection shield.

Each support element contains three tubular parts enclosing each other. The outer tube adjacent to the winding housing as well as the inner tube adjacent to the winding housing consists of fiberglass-reinforced plastic. The tubes are connected to each other via a central tube of aluminum. By using these materials with different expansion characteristics and on the basis of suitable design of the individual tube lengths, a form-fitting as well as friction-force connection via the support elements between the outer and the winding housing can always be assured during the assembly of the entire structure at room temperature as well as in operation of this housing at the low temperature.

Such nolding devices, however, are either overdesigned, so that they can assume the additional stresses during transport, or special transport supports are provided which must be removed before the magnet device is set in operation. Overdesigned holding devices, however, lead to large heat losses, while additional shipping supports make the magnetic device more difficult to handle.

It is therefore an object of the present invention to improve the holding device mentioned at the outset in such a manner that relatively small amounts of heat are transferred from the outer housing to the cooled winding housing and that, nevertheless, the additional dynamic stresses occurring during transport can be intercepted without additional transport supports.

SUMMARY OF THE INVENTION

According to the present invention, this problem is solved by suspending the winding housing by means of a poorly heat conducting suspension device in the outer housing; designing the tubular support element as a compression support, the length of which can be changed, so that a form locking fit with the outer housing and with the winding housing can be set to occur at room temperature; and attaching this support element, by means of a fastening device having a spring element, to the radiation protection shield in such a manner that a form lock fit with the outer housing always exists.

The holding device according to the present invention, therefore represents a combination of a suspension with additional compression supports. Here, the suspension of the cold inertial masses alone is effective in the steady-state, i.e., in the operating condition, while in the non-operating state such as during transportation, where the winding housing with the magnet winding is also at room temperature, an additional force connection between the outer housing and the winding housing exists via one or more compression supports. Since the compression supports are always pressed against the outer housing by means of the fastening device attached to the radiation protection shield, the frictional connection between the compression supports and the winding housing is advantageously broken with increasing cooling down of the suspended winding housing due to the shrinkage of this winding housing connected thereto. Heat inflow via the compression supports to the winding housing is therefore precluded during operation. In addition, once these support elements are built in, they are advantageously set in operation again automatically if the magnet winding is warmed up, for instance, for shipment.

DETAILED DESCRIPTION

The holding device according to the present invention can be provided for any superconducting magnet device, the windings of which can be arranged in a separate winding housing that must be cooled down concurrently to the superconducting operating temperature, which housing is contained within an outer housing, generally a vacuum housing which is at room temperature. The magnet device may be, for instance, the base field magnet of a nuclear spin tomography system (nuclear magnetic resonance system). Such magnets must be transportable. Thus, the corresponding structure must be secured against the dynamic loads occurring in the transporting process. This requirement can be met with the holding device according to the present invention.

Figure 1:
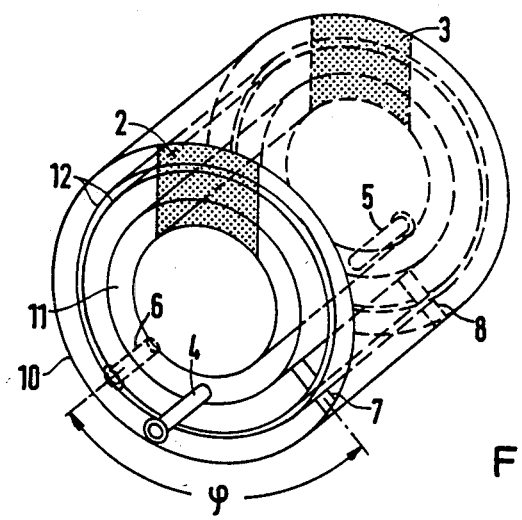
FIG. 1 is a schematic illustration of a holding device according to the present invention in an oblique view.

As illustrated by FIG. 1, the holding device comprises one or more suspension devices 2 and 3 of convential design and a predetermined number of support elements 4 to 8 serving as compression supports. By means of the suspension devices 2 and 3, a winding housing 11 which encloses a superconducting magnet winding, not detailed in the figures, is suspended within an outer housing 10. Between the outer housing 10 and the winding housing 11, a radiation protection shield 12 is arranged which is likewise supported concurrently by the suspension devices 2 and 3. Parts 11 and 12 are fixed in operation, i.e., in their cooled-down state, only in the vertical direction within the outer housing by this suspension alone. For this purpose only the force of gravity and the inertia of the suspended mass weights of the winding housing 11 and the radiation protection shield 12 act as stabilizers. Such suspension devices consist advantageously of a poorly heat-conducted material. Thus, according to the illustrated embodiment of FIG. 1, plate or disc-shaped holding parts, adapted to the shape of the outer wall of the inner housing 11 and made of fiberglass-reinforced plastic can be provided, via which the winding housing 11 and the radiation protection shield 12 are rigidly connected mechanically to the outer housing at their geodetically highest points. Besides such suspension devices, cable or ribbons of poorly heat-conducting materials, for instance, can also be used for suspending the winding housing 11 and the radiation protection shield 12.

Since fastening these parts 11 and 12 by suspension alone is not sufficient for the shocks or acceleration forces which occur especially during transport, the additional support elements 4 to 8 are provided for such instances. Of the compression supports shown in the figure, which are effective only in the warm state of the winding housing 11 and the radiation protection shield 12, the support elements 4 and 5 provide axial support at the end face. Three elements 6 to 8 which are support elements required for radial support are visible. Between the compression supports 6 and 7 on the bottom side, lying, for instance, in a commoon cross-sectional plane, an angle of about 90° can be enclosed.

Figure 2:
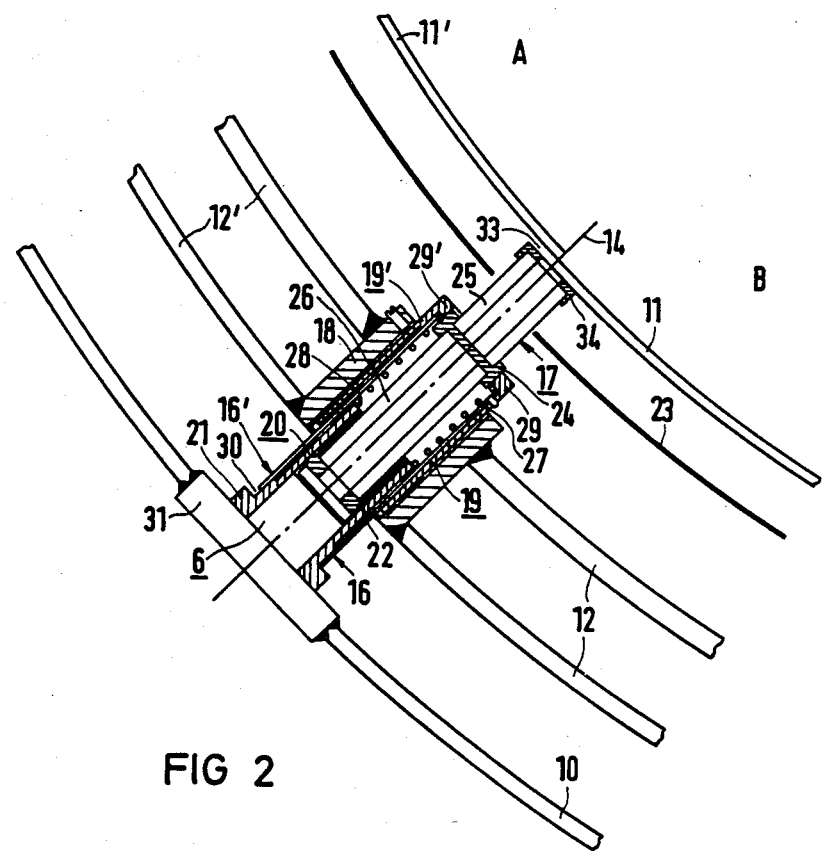
FIG. 2 is a longitudinal section through a support element for this holding device.

Details of the identically designed compression supports, for instance, of the element 6, may be seen in greater detail from the longitudinal section of FIG. 2.

In FIG. 2, the position of the radial support element 6 between corresponding sections of the winding housing 11 and the outer housing 10 is indicated for the case where the winding housing 11, as well as the radiation protection shield 12, has cooled down. The position is also shown as well for the case where all parts are at room temperature. To illustrate these different temperature conditions, a sectional plane is drawn through the support element 6. Accordingly, the position of the parts located on the left side A of the sectional plane 14 are those after the cooling down is complete while the right half of the figure B represents the conditions at room temperature. Parts which, due to the cooling, occupy a changed position are characterized by a "prime" at their reference symbol.

According to the illustrated embodiment of the support element 6 serving as a compression support shown in FIG. 2, two tubular supports 16 and 17, which partially enclose each other concentrically, of a fiberglass-reinforced plastic, form a base element. The outer tubular support 16 is braced against the outer housing 10 and the radiation protection shield 12, which is designed with double walls and can be cooled, for instance, with liquid nitrogen. The inner tubular support 17 braces the inner housing 11, designed as a helium container, against the outer housing 10 serving as a vacuum jacket The entire support element 6 is fastened to the radiation protection shield 12. To this end, this shield is provided with a tubular threaded bushing 18 of metal, into which a corresponding metallic threaded sleeve 19 is screwed. This sleeve surrounds the tubular support 16 and is rigidly connected thereto, for instance, by cementing. At the open end of the tubular support 16 facing the outer housing 10 a metallic pressure piece 20 is slidingly inserted into tubular support 16. An enlarged, leg-like part 21, acts as a stop to brace the tubular support 16 against the outer housing 10.

Optionally, this stop part 21 can be omitted, so that then the tubular support 16 can be braced directly against the outer housing 10. In the assembly, the tubular support 16 with the pressure piece 20 extending it can be set against the outer housing 10 by rotating the threaded sleeve 19 firmly surrounding it, after which sleeve 19 is secured against further rotation. Subsequently, the inner tubular support 17 is screwed into the pressure piece 20. For this purpose, the inner tubular support 17 is firmly jacketed at its end facing the outer housing 10 by a metallic threaded sleeve 22 which can be screwed into a corresponding thread on the inside of the pressure piece 20.

Thereupon, the winding housing 11 serving as the helium container as well as an optionally provided further radiation protection shield 23 which can be kept at a temperature of about 30 K, is mounted. Subsequently, the tubular support 17 is screwed back in the direction of the container wall of the winding housing 11 to press against it and is secured against rotation by means of an intermediate piece 24 of metal. This intermediate piece which has the shape of a washer or, according to the illustrated embodiment a circular disc, divides the tubular support 17 into a partial section, 25 facing the winding housing 11 and a partial section 26 facing the outer housing 10, in order to interrupt the tubular support 17. To this intermediate piece 24 the two partial pieces 25 and 26 are rigidly fastened for instance, by cementing. In addition, the intermediate piece 24 so fastened to the tubular support 17 can advantageously take over the function of the radiation protection shield 12 interrupted in the region of the support element 6, by tying it thermally to the radiation protection shield 12, for instance, via copper braids, not detailed here.

The radiation protection shield 12 is advantageously cooled down first, in the course of which it shrinks toward a smaller radius. In order to ensure, in spite of this, a form-locking fit of the support element 6 with the outer housing 10, a coil spring 27, for instance, of a beryllium-copper alloy is provided which is clamped between the upper end 28, facing the winding container 11, of the pressure piece 20 and an end piece 29 shaped like a leg or with the threaded sleeve 19 rigidly connected to the radiation protection shield 12. The displacements caused by the cooling of the radiation protection shield 12 are then made possible via sliding motions of the tubular support 16 mounted on the threaded sleeve 19 relative to the pressure piece 20 as well as movement of sleeve 19 and tubular support 16 relative to the intermediate piece 24. Thus, a corresponding gap 30 is formed between the foot-like end piece 21 of the pressure piece 20 and the outer tubular support 16 ridigily connected to the radiation protection shield 12. Since the support element 6 is only braced against a part 31 of the outer housing 10, i.e., is not fastened ridigly thereto, slight sliding motions of the support element relative to the outer housing are also made possible.

When the winding housing 11 is subsequently cooled down, the windings housing 11 shrinks toward a smaller radius. Due to is suspension inside the warm outer housing 10, a gap 33 with a dimension a of several millimeters in the radial direction is then formed between the cooled down winding housing 11 and the end 34, of the inner tubular support 17 of the support element 6 facing it. The heat transfer path via the support element 6 to the cooled down winding housing 11 is thereby interrupted.

According to the illustrated embodiment shown in FIG. 2, it was assumed that the tubular parts of the support element 6 have circular cross sections. Optionally, however, other cross-sectional shapes such as rectangular or oval ones are also suitable.

What is claimed is:

1. A device for holding a winding housing enclosing a superconducting magnet winding which is to be cooled to a low temperature, the winding housing being surrounded by at least one radiation protection shield which can be kept at a comparatively higher temperature, and the radiation protection shield enclosed by an outer housing kept at approximately room temperature, comprising:
   (a) at least one poorly heat-conducting suspension device suspending the winding housing and radiation shield within the outer housing;
   (b) at least one rigid tubular support element disposed between the outer housing and the winding housing and connected to the radiation protection shield, and consisting at least partially of poorly heat-conducting material said tubular support comprising:
      (i) a pressure support of adjustable length, permitting a form-lock fit between the outer housing and the winding housing to be set at room temperature, and
      (ii) a fastening device attaching said support to the radiation protection shield; and
   (c) a spring element biasing said support in a direction such that a form-locking fit with the outer housing always exists.

2. A holding device according to claim 1, wherein said suspension device comprises several plate shaped or disc shaped elements from which the winding housing and the radiation protection shield are suspended within the outer housing.

3. A holding device according to claim 2 wherein said suspension elements consist of a fiberglass-reinforced plastic.

4. A holding device according to claim 1 wherein said support element comprises first and second tubular supports partly enclosing each other, said first tubular support extending between the radiation protection shield and outer housing and rigidly connected to the radiation protection shield and said second tubular support extending between said winding housing and outer housing braced against the outer housing by means of said spring element, said spring element acting between said radiation shield and said second tubular support.

5. A holding device according to claim 4, and further including a threaded bushing into which said first tubular support is screwed said threaded bushing extending through the radiation protection shield and rigidly connected thereto.

6. A holding device according to claim 5, and further including a first threaded sleeve which partially surrounds said first tubular support and is rigidly connected thereto for screwing said first tubular support into said bushing.

7. A holding device according to claim 6 wherein said second tubular support extends through the first tubular support and further including, secured to the end of said second tubular support facing the outer housing, a tubular pressure piece and wherein said spring elements comprises a spring braced against said pressure piece.

8. A holding device according to claim 7 wherein said tubular pressure piece is threaded on the inside and further including a second threaded sleeve attached to the end of said second tubular screwed support into said pressure piece.

9. A holding device according to claim 8 wherein said first and second tubular supports consist of fiberglass-reinforced plastic material.

10. A holding device according to claim 9 wherein said bushing, first threaded sleeve, and pressure piece and second threaded sleeve consist of metal.

11. A holding device according to claim 1 wherein said support element comprises first and second tubular supports partly enclosing each other, said first tubular support extending between the radiation protection shield and outer housing and rigidly connected to the radiation protection shield and said second tubular support extending between said winding housing and outer housing braced against the outer housing by means of said spring element, said spring element acting between said radiation protection shield and said second tubular support.

12. A holding device according to claim 11, and further including a threaded bushing into which said first tubular support is screwed said threaded bushing extending through the radiation protection shield and rigidly connected thereto.

13. A holding device according to claim 12, and further including a first threaded sleeve which partially surrounds said first tubular support and is rigidly connected thereto for screwing said first tubular support into said bushings.

14. A holding device according to claim 13 wherein said second tubular support extends through the first tubular support and further including, secured to the end of said second tubular support facing the outer housing, a tubular pressure piece and wherein said spring elements comprises a spring braced against said pressure piece.

15. A holding device according to claim 14 wherein said tubular pressure piece is threaded on the inside and further including a second threaded sleeve attached to the end of said second tubular support threaded into said pressure piece.

16. A holding device according to claim 15 wherein said first and second tubular supports consist of fiberglass-reinforced plastic material.

17. A holding device according to claim 16 wherein said bushing, first threaded sleeve, and pressure piece and second threaded sleeve consist of metal.

18. A holding device according to claim 11 wherein said second tubular support extends through the first tubular support and further including, secured to the end of said second tubular support facing the outer housing, a tubular pressure piece and wherein said spring elements comprises a spring braced against said pressure piece.

19. A holding device according to claim 18 wherein said tubular pressure piece is threaded on the inside and further including a second threaded sleeve attached to the end of said second tubular support screwed into said pressure piece.

20. A holding device according to claim 12 wherein said second tubular support extends through the first tubular support and further including, secured to the end of said second tubular support facing the outer housing, a tubular pressure piece and wherein said spring elements comprises a spring braced against said pressure piece.

* * * * *